United States Patent
Chang

(10) Patent No.: US 6,184,089 B1
(45) Date of Patent: Feb. 6, 2001

(54) METHOD OF FABRICATING ONE-TIME PROGRAMMABLE READ ONLY MEMORY

(75) Inventor: Kuang-Yeh Chang, Taipei (TW)

(73) Assignee: United Microelectronics Corp., Hsinchu (TW)

(*) Notice: Under 35 U.S.C. 154(b), the term of this patent shall be extended for 0 days.

(21) Appl. No.: 09/239,034

(22) Filed: Jan. 27, 1999

(51) Int. Cl.[7] .................................................. H01L 21/336
(52) U.S. Cl. ........................... 438/266; 438/278; 438/649
(58) Field of Search ..................................... 438/257, 261, 438/263, 264, 266, 267, 278, 303, 595, 649

(56) References Cited

U.S. PATENT DOCUMENTS

| | | | |
|---|---|---|---|
| 5,702,965 | * | 12/1997 | Kim ....................................... 438/266 |
| 5,705,416 | * | 1/1998 | Kim et al. ............................. 438/257 |
| 5,879,992 | * | 3/1999 | Hsieh et al. .......................... 438/266 |
| 5,970,371 | * | 10/1999 | Hsieh et al. .......................... 438/266 |

* cited by examiner

Primary Examiner—Charles Bowers
Assistant Examiner—Jack Chen
(74) Attorney, Agent, or Firm—Hickman Coleman & Hughes, LLP

(57) ABSTRACT

A method of fabricating a one-time programmable read only memory (OTP-ROM) with reduced size is disclosed. In accordance with the method of the present invention, a stacked structure is formed on a substrate. The stacked structure comprises a first oxide layer, a first polysilicon layer, and a second oxide layer formed in sequence on the substrate. The substrate beside the stacked structure is exposed by the stacked structure. An implanted region is formed in the exposed substrate beside the stacked structure. A spacer is formed on a sidewall of the stacked structure. A silicide layer is formed on the implanted region. A silicon nitride layer is formed to cover the second oxide layer, the spacer, and the silicide layer. A second polysilicon layer is formed to cover the silicon nitride layer. The second polysilicon layer is patterned to form a control gate. The first polysilicon layer is further patterned to form a floating gate.

13 Claims, 5 Drawing Sheets

US 6,184,089 B1

METHOD OF FABRICATING ONE-TIME PROGRAMMABLE READ ONLY MEMORY

BACKGROUND OF THE INVENTION

1. Field of the Invention

The present invention relates to a semiconductor fabricating method. More particularly, the present invention relates to a method of fabricating a read only memory.

2. Description of the Related Art

As the function of a microprocessor becomes more powerful and the amount of computation being processed by software programs increases, required memory capacity increases correspondingly. Therefore, fabricating high-capacity and low-cost memories is an important subject for the semiconductor manufacturers. The memories are simply classified into two types, which are read only memory (ROM) and random access memory (RAM) according to the read/write functions. A ROM can only perform reading functions. A RAM can further perform reading the writing functions. According to the methods for data storage, ROMs can be further classified into, for example mask ROMs, programmable ROMs (PROM), erasable programmable ROMs (EPROM), electrically erasable programmable ROMs (EEPROM), etc. According to the data processing function, RAMs can be classified into static RAMs (SRAM) and dynamic RAMs (DRAM).

ROMs are widely used in mini-computers, microprocessor systems, and other digital devices for storing system information and the terminate and stay resident (TSR) programmers such as BIOS. Since the fabrication of a ROM is very complicated, and includes numerous time-consuming processes and preparations for materials, the manufacturers normally code the needed programs and information from customers into memories during the fabrication process.

Since the rest of the structures, with the exception of the information stored during the programming process, are the same for most ROMs, partially finished ROMs are usually stocked at the stage before the programming process. After a specific program is given by customers, the required photomask is formed in order to store the program codes into the partially finished ROMs. In this manner, the whole fabrication process of the ROM can be quickly finished. The foregoing method, which is also known as a post-programming mask-type ROM method, is frequently used in industry.

A channel transistor is normally used as a memory cell in a ROM. Within the programming process, dopants are selectively implanted into certain channels to modify the threshold voltage in order to control the on/off state of a memory cell. A ROM includes a polysilicon word line WL bridging over a bit line BL, and a channel of a memory cell between bit lines BL and under the word line WL. In the ROM, the stored binary data, 0 or 1, is dependent on whether or not the channel has ions implanted.

FIGS. 1 to 3 schematically illustrate the representation of the conventional method for fabricating a PROM, wherein FIG. 1 is a schematic, top-view layout showing a conventional PROM, FIG. 2 is a schematic, cross-sectional view of FIG. 1 taken along line I—I, and FIG. 3 is a schematic, cross-sectional view of FIG. 1 taken along line II—II.

Referring to FIGS. 1, 2, and 3, a pad oxide layer (not shown) is formed on a substrate 10 by thermal oxidation. A field oxide layer 14 is formed in the substrate 10 by local oxidation for defining the active areas on the substrate. A wet etching is performed to remove the pad oxide layer. An oxide layer 12 is formed next to the field oxide layer 14 by thermal oxidation. A first polysilicon layer is formed on the oxide layer 12 by low-pressure chemical vapor deposition. A photolithographic and etching process is performed on the first polysilicon layer to form a first polysilicon layer 16.

An inter-poly dielectric layer (not shown) is formed on the first polysilicon layer 16 by low-pressure chemical vapor deposition. Then, a second polysilicon layer (not shown) is formed on the inter-poly dielectric layer by low-pressure chemical vapor deposition. A photolithographic and etching process is performed to pattern the second polysilicon layer and the inter-poly dielectric layer. A second polysilicon layer 20 and an inter-poly dielectric layer 18 are formed.

A photolithographic and etching process is performed with the second polysilicon layer 20 as a mask. The polysilicon layer 16 is patterned. The second polysilicon layer 20 again as a mask to implant ion with a high concentration. An implanted region 22 is formed in the substrate 10. A dielectric layer 24 is formed over the substrate 10 by low-pressure chemical vapor deposition. A contact opening 26 is formed in the dielectric layer 24 by a photolithographic and etching process. A metallic layer 28 is formed to fill the contact opening 26 and electrically couple with the implanted region 22. The metallic layer 28 is sued as a bit line. Some follow-up steps are performed to complete a PROM.

In the conventional method described above, it is difficult to fabricate a PROM with a further reduction in size because the reduction of the contact opening is limited. Moreover, the existence of the field oxide layer affects the size reduction of a PROM and surface planarization. Because the surface varies in different regions, it is difficult to obtain etching uniformity in the dry etching step, which causes difficulty in determining the etching time. In addition, the contact opening 26 is filled with metallic layer 28 for forming a bit line. Thus, reflection interference of a metallic layer 28 cannot be avoided.

Another conventional method thus is provided to reduce the size of a PROM, which comprises forming buried bit line under the field oxide layer. But difficulty is still encountered with the existence of a field oxide layer in this method. Thus, the size reduction is limited and the planarization is still poor. Moreover, the field oxide layer lies over a buried bit line, which makes a self-aligned process for forming a bit line difficult to perform.

SUMMARY OF THE INVENTION

It is an object of the present invention to provide a method of fabricating a one-time programmable read only memory (OTP-ROM) with reduced size. In accordance with the method of the present invention, a stacked structure is formed on a substrate. The stacked structure comprises a first oxide layer, a first polysilicon layer, and a second oxide layer formed in sequence on the substrate. The substrate beside the stacked structure is exposed by the stacked structure. An implanted region is formed in the exposed substrate beside the stacked structure. A spacer is formed on a sidewall of the stacked structure. A silicide layer is formed on the implanted region. A silicon nitride layer is formed to cover the second oxide layer, the spacer, and the silicide layer. A second polysilicon layer is formed to cover the silicon nitride layer. The second polysilicon layer is patterned to form a control gate. The first polysilicon layer is further patterned to form a floating gate.

This and other objects and advantages of the present invention will no doubt become obvious to those of ordinary skill in the art after having read the following detailed description of the preferred embodiments that are illustrated in the various figures.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
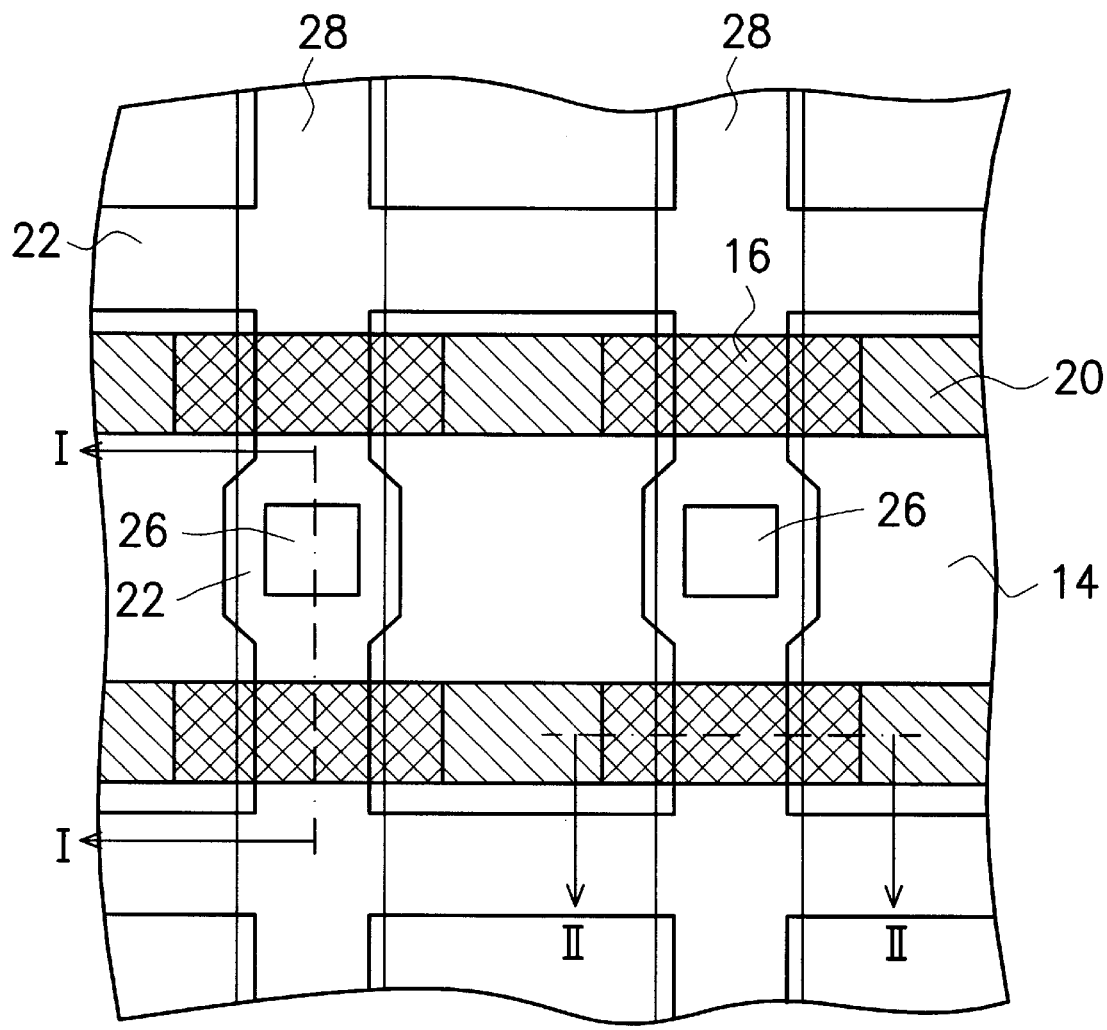
FIG. 1 is a schematic, top-view layout showing a conventional PROM.
Figure 2:
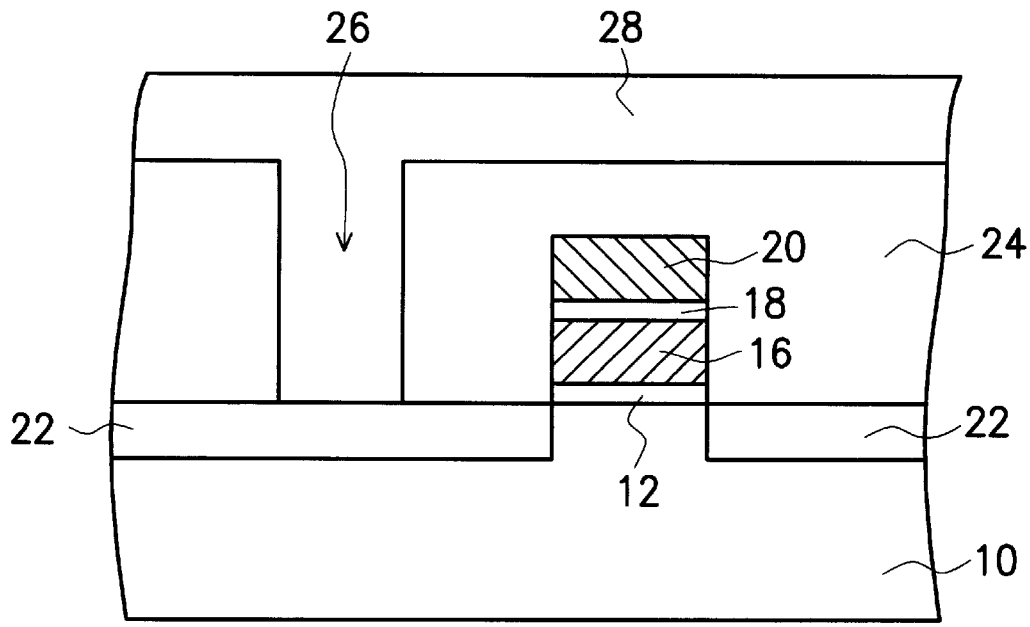
FIG. 2 is a schematic, cross-sectional view of FIG. 1 taken along line I—I.
Figure 3:
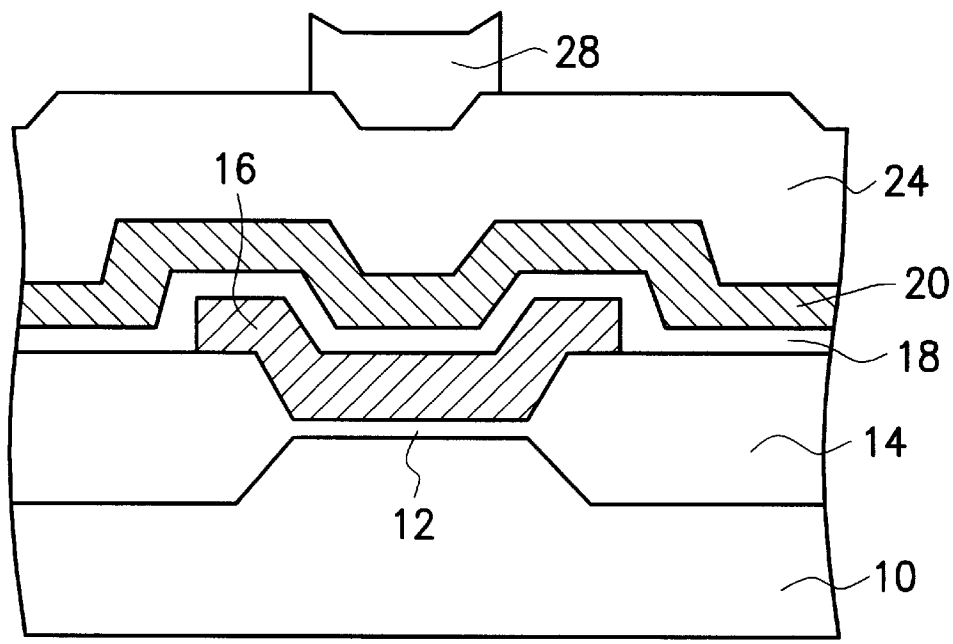
FIG. 3 is a schematic, cross-sectional view of FIG. 1 taken along line II—II.

Reference will now be made in detail to the present preferred embodiments of the invention, examples of which are illustrated in the accompanying drawings. Wherever possible, the same reference numbers are used in the drawings and the description to refer to the same or like parts.

Figure 4:
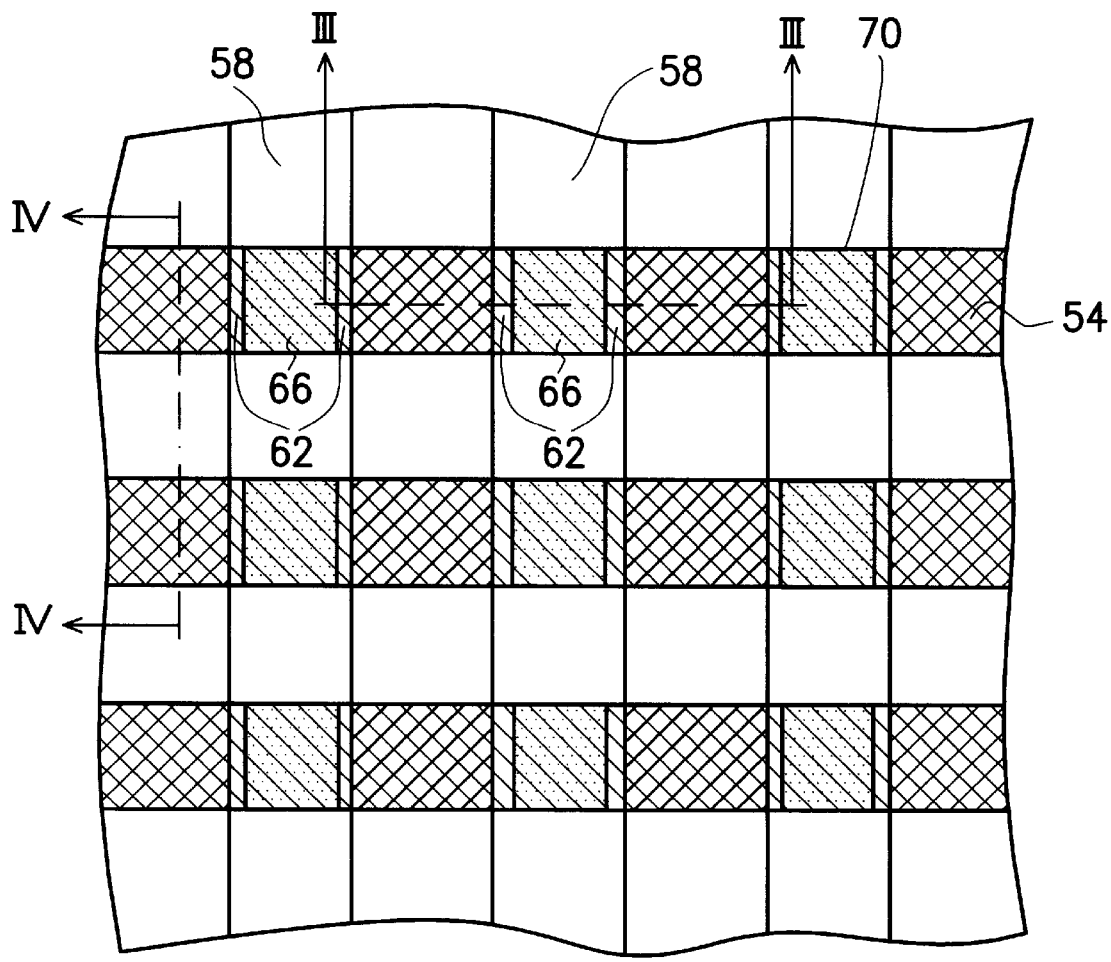
FIG. 4 is a schematic, top-view layout of an OTP-ROM according to one preferred embodiment of the invention.

FIG. 4 is a schematic, top-view layout of an OTP-ROM according to one preferred embodiment of the invention. FIGS. 5A through 5E are schematic, cross-sectional views of FIG. 4 taken along line III—III according to one preferred embodiment of the invention.

Figure 5A:
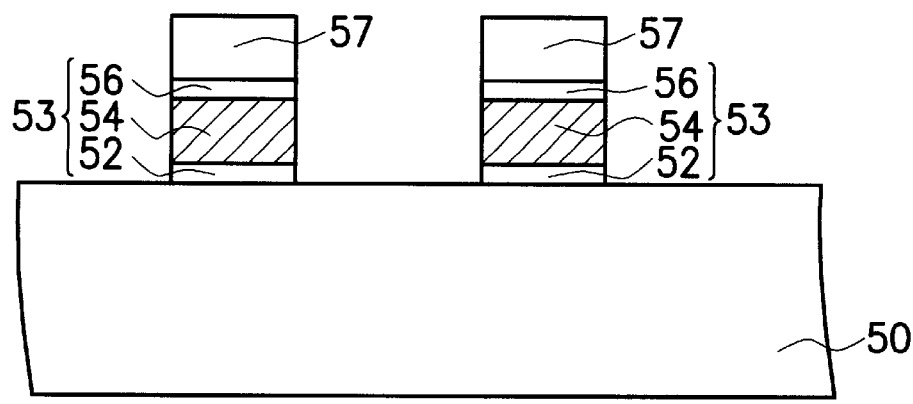
FIGS. 5A through 5E are schematic, cross-sectional views of FIG. 4 taken along line III—III according to one preferred embodiment of the invention.

In FIG. 5A, a stacked structure 53 is formed on a substrate 50. The stacked structure is formed by forming an oxide layer (not shown) and a polysilicon layer in sequences on a substrate 50. The oxide layer can be, for example, formed by thermal oxidation. The polysilicon layer can be, for example, formed by low-pressure chemical vapor deposition. Another oxide layer (not shown) is formed on the polysilicon layer, for example, by chemical vapor deposition. A photoresist layer 57 is formed to cover the oxide layer, the polysilicon layer, and another oxide layer. An etching step is performed to pattern the oxide layer, the polysilicon layer, and the another oxide layer. An oxide layer 52, a polysilicon layer 54, and an oxide layer 56 are formed. The oxide layer 52, the polysilicon layer 54, and the oxide layer 56 together form a stacked structure 53.

Figure 5B:
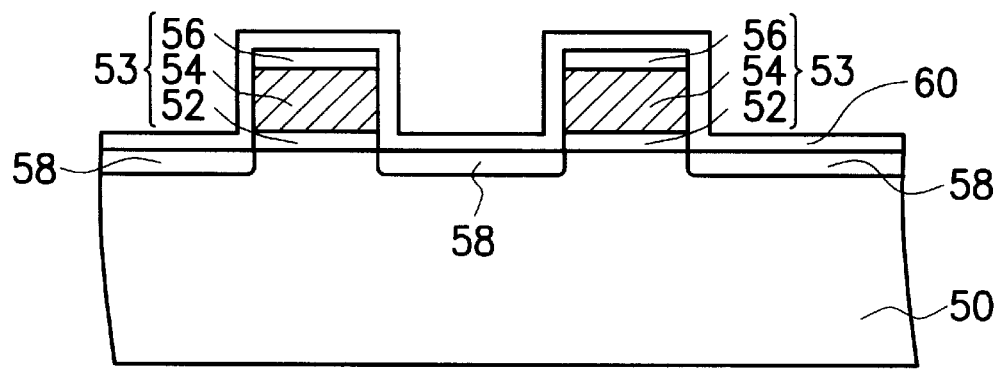

In FIG. 5B, the photoresist layer 57 is used as a mask when a self-aligned ion implantation is performed. Ions are implanted into the substrate 50 beside the stacked structure 53 to form an implanted region 58. The photoresist layer 57 is removed to expose the oxide layer 56. An annealing step is performed. The implanted region 58 is used as a bit line. Specifically, the bit line is a buried bit line. A silicon nitride layer 60 is formed over the substrate 50 to cover the stacked structure 53.

Figure 5C:
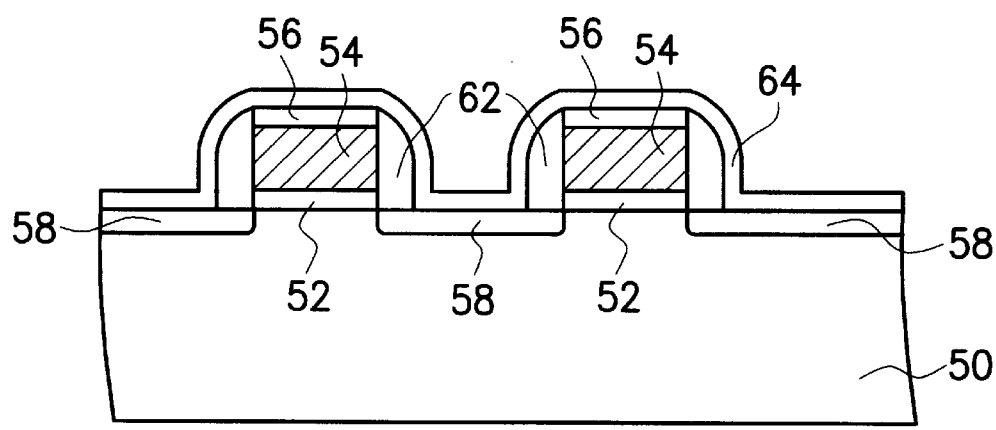

In FIG. 5C, an etching back step is performed. The silicon nitride layer 60 is etched to form a silicon nitride spacer 62. A metallic layer 64 is formed over the substrate 50 to cover the spacer 62 and the oxide layer 56 by sputtering. The suitable material of the metallic layer 64 can be, for example, titanium or any other suitable metal.

Figure 5D:
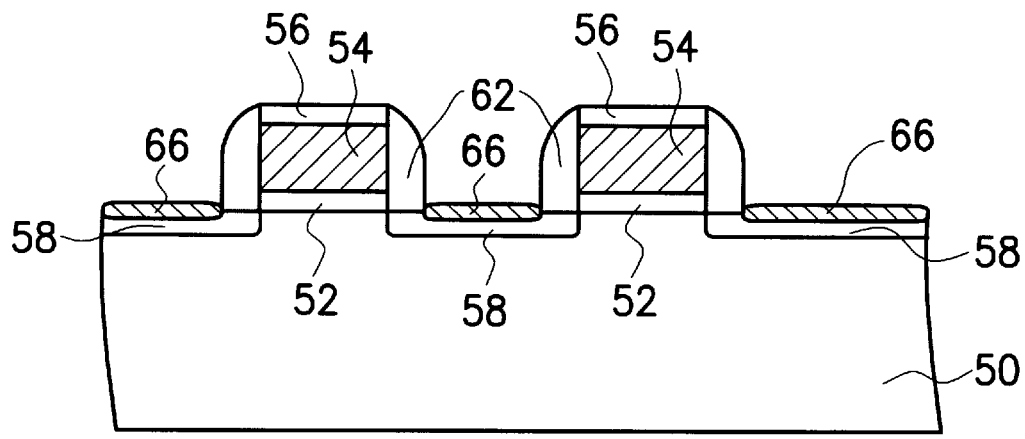

In FIG. 5D, a rapid thermal process is performed. A portion of the metallic layer 64, which is in contact with the substrate 50, is converted into a silicide layer 66. In case that the material of the metallic layer 64 is titanium, the silicide layer 66 is a titanium silicide layer. The remaining metallic layer 64 is removed.

Figure 5E:
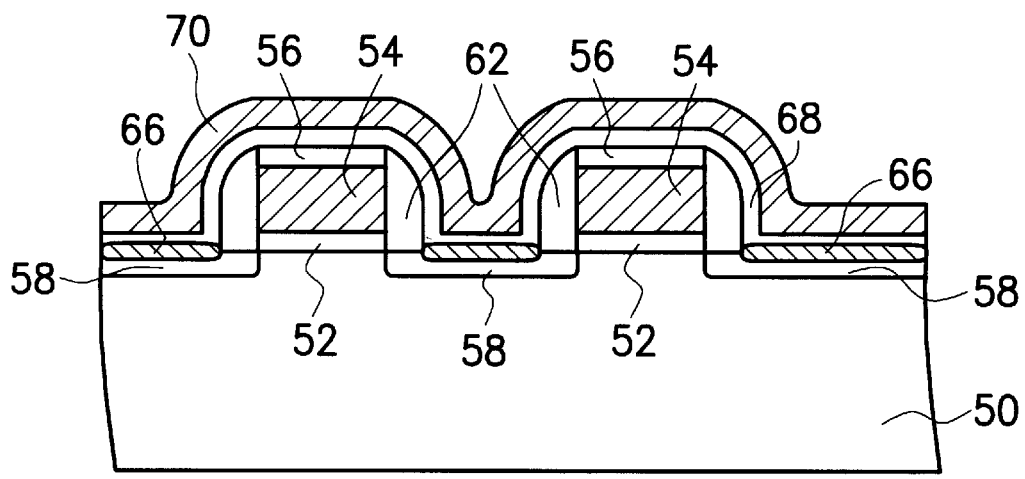
Figure 6:
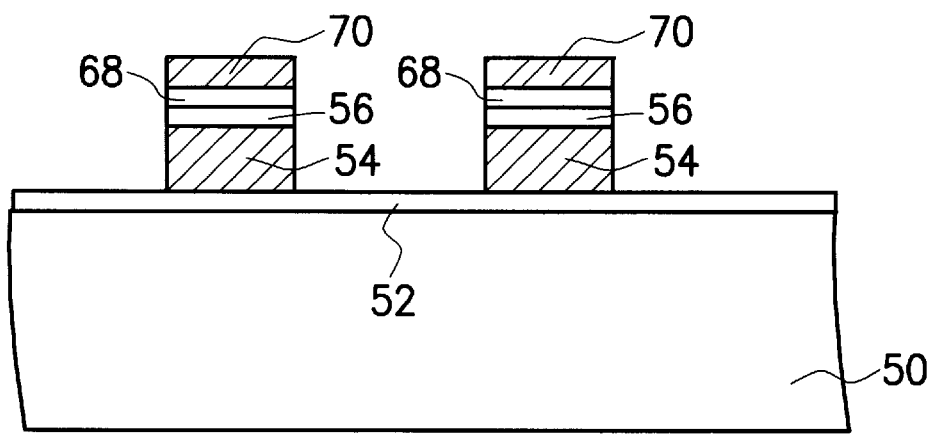
FIG. 6 is a schematic, cross-sectional view of FIG. 4 taken along line IV—IV showing the fabrication process of FIG. 5E.

In FIG. 5E, a silicon nitride layer 68 is formed over the substrate 50 to cover the oxide layer 56, the spacer 62, and the silicide layer 66. The silicon nitride layer 68 can be, for example, formed by plasma chemical vapor deposition. A polysilicon layer is formed on the silicon nitride layer 68. The polysilicon layer can be, for example, formed by low-pressure chemical vapor deposition. The silicon nitride layer 68 and the oxide layer 56 together form an inter-metal dielectric. A conventional photolithographic and etching process is performed. The polysilicon layer is patterned to form a polysilicon layer 70. The polysilicon layer 70 is used as a control gate. The polysilicon layer 54 is etched with the polysilicon layer 70 serving as a mask by a self-aligned etching process. The polysilicon layer 54 is etched to form a floating gate. An ion implantation step is performed. Reference is made to FIG. 6, which is a schematic, cross-sectional view of FIG. 4 taken along line IV—IV showing the fabrication process of FIG. 5E.

Some follow-up steps are performed according to the conventional method to complete a PROM. It is appreciated that the follow-up steps are well known to those skilled in the art, so these follow-up steps are not here described in detail.

In accordance with the present method of this invention, the bit line can be formed by self-aligned ion implantation with the polysilicon layer 54, while the floating gate can be self-aligned with the polysilicon layer 70. Therefore, the method for fabricating a PROM is simplified and the size of PROM can be reduced. Furthermore, the bit line is formed in a self-aligned process with the polysilicon layer 54 and the silicide layer 66. A silicide layer 66 lies on the bit line, which reduce the resistance of the bit line and thus enhances the performance of a PROM. It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a one-time programmable read only memory, comprising the steps of:

forming a stacked structure on a substrate, wherein the stacked structure comprises a first oxide layer, a first polysilicon layer, and a second oxide layer formed in sequence on the substrate, and the substrate beside the stacked structure is exposed by the stacked structure;

forming an implanted region in the exposed substrate beside the stacked structure;

forming a spacer on a sidewall of the stacked structure;

forming a silicide layer on the implanted region;

forming a silicon nitride layer to directly cover the second oxide layer, the spacer, and the silicide layer, forming a second polysilicon layer to cover the silicon nitride layer; and patterning the second polysilicon layer to form a control gate and further patterning the first polysilicon layer to form a floating gate.

2. The method of claim 1, wherein the material of the spacer comprises silicon nitride.

3. The method of claim 1, wherein the silicide layer comprises a titanium silicide layer.

4. The method of claim 1, wherein the first polysilicon layer is formed by low-pressure chemical vapor deposition.

5. The method of claim 1, wherein the second polysilicon layer is formed by low-pressure chemical vapor deposition.

6. The method of claim 1, wherein the step of forming the silicide layer comprises:

forming a metallic layer on the substrate exposed by the second oxide layer, the spacer, and the stacked structure;

performing a thermal treatment to covert the metallic layer, which is in contact with the substrate, into the silicide layer; and removing the remaining metallic layer.

7. The method of claim 1, wherein the step of patterning the second polysilicon layer and further patterning the first polysilicon layer comprises a photolithographic and etching process.

8. The method of claim 1, wherein the further patterning of the first polysilicon layer comprises a self-aligned etching step with the second polysilicon layer serving as a mask.

9. A method of fabricating a one-time programmable read only memory, comprising the steps of:

forming a stacked structure on a substrate, wherein the stacked structure comprises a first oxide layer, a first polysilicon layer, and a second oxide layer formed in sequence on the substrate, and the substrate beside the stacked structure is exposed by the stacked structure;

forming an implanted region in the exposed substrate beside the stacked structure;

forming a spacer on a sidewall of the stacked structure;

forming a silicide layer on the implanted region in the substrate;

forming a silicon nitride layer to directly cover the second oxide layer, the spacer, and the silicide layer;

forming a control gate on the silicon nitride layer.

10. The method of claim 9, wherein the step of forming the silicide layer comprises:

forming a metallic layer on the substrate;

performing a thermal treatment to convert the metallic layer into the silicide layer; and removing the remaining metallic layer.

11. The method of claim 9, wherein the material of the spacer comprises silicon nitride.

12. The method of claim 9, wherein the step of forming the control gate comprises:

forming a second polysilicon layer on the silicon nitride layer; and patterning the second polysilicon layer to form a control gate.

13. The method of claim 9, further comprising patterning the first polysilicon layer to form a floating gate after the formation of the control gate.

* * * * *